US010217732B2

(12) United States Patent
Elsayed et al.

(10) Patent No.: US 10,217,732 B2
(45) Date of Patent: Feb. 26, 2019

(54) TECHNIQUES FOR FORMING A COMPACTED ARRAY OF FUNCTIONAL CELLS

(71) Applicant: INTEL CORPORATION, Santa Clara, CA (US)

(72) Inventors: Rany T. Elsayed, Rancho Cordova, CA (US); Niti Goel, Portland, OR (US); Silvio E. Bou-Ghazale, Hillsboro, OR (US); Randy J. Aksamit, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/124,817

(22) PCT Filed: Jun. 25, 2014

(86) PCT No.: PCT/US2014/044105
§ 371 (c)(1),
(2) Date: Sep. 9, 2016

(87) PCT Pub. No.: WO2015/199682
PCT Pub. Date: Dec. 30, 2015

(65) Prior Publication Data
US 2017/0018543 A1 Jan. 19, 2017

(51) Int. Cl.
*H01L 21/027* (2006.01)
*G06F 17/50* (2006.01)
(Continued)

(52) U.S. Cl.
CPC ...... *H01L 27/0207* (2013.01); *G06F 17/5068* (2013.01); *H01L 21/0274* (2013.01);
(Continued)

(58) Field of Classification Search
CPC .................. H01L 27/0207; G06F 17/5068
See application file for complete search history.

(56) References Cited

U.S. PATENT DOCUMENTS 6,911,730 B1   6/2005  New
8,839,168 B2 * 9/2014  Kye ................... G06F 17/5081
                                                        716/110
(Continued)

FOREIGN PATENT DOCUMENTS

JP    H05298394 A    11/1993
JP    2010087194 A    4/2010
(Continued)

OTHER PUBLICATIONS

Komami et al., Complementary patterning demonstration with e-beam direct writer and spacer DP process of 11 nm node, Mar. 2012, Proc. SPIE 8323, Alternative Lithographic Technologies IV, 832313, pp. 1-10.*
(Continued)

*Primary Examiner* — Jose R Diaz
(74) *Attorney, Agent, or Firm* — Finch & Maloney PLLC

(57) ABSTRACT

Techniques are disclosed for forming a compacted array of functional cells using next-generation lithography (NGL) processes, such as electron-beam direct write (EBDW) and extreme ultraviolet lithography (EUVL), to form the boundaries of the cells in the array. The compacted array of cells may be used for field-programmable gate array (FPGA) structures configured with logic cells, static random-access memory (SRAM) structures configured with bit cells, or other memory or logic devices having cell-based structures. The techniques can be used to gain a reduction in area of 10 to 50 percent, for example, for the array of functional cells, because the NGL processes allow for higher precision and closer cuts for the cell boundaries, as compared to conventional 193 nm photolithography. In addition, the use of NGL
(Continued)

processes to form the boundaries for the cells may also reduce lithography induced variations that would otherwise be present with conventional 193 nm photolithography.

25 Claims, 7 Drawing Sheets

(51) Int. Cl.
- H01L 27/02 (2006.01)
- H01L 27/11 (2006.01)
- H01L 27/118 (2006.01)
- H03K 19/00 (2006.01)
- H01L 21/8234 (2006.01)
- H01L 29/16 (2006.01)

(52) U.S. Cl.
CPC .. H01L 21/0277 (2013.01); H01L 21/823475 (2013.01); H01L 27/11 (2013.01); H01L 27/11807 (2013.01); H01L 29/16 (2013.01); H03K 19/00 (2013.01); H01L 2027/11853 (2013.01); H01L 2027/11866 (2013.01); H01L 2027/11875 (2013.01)

(56) References Cited

U.S. PATENT DOCUMENTS

| | | |
|---|---|---|
| 2009/0255801 A1 | 10/2009 | Haas |
| 2012/0254817 A1 | 10/2012 | Sherlekar |
| 2013/0196517 A1 | 8/2013 | Tsujita et al. |
| 2014/0131813 A1 | 5/2014 | Liaw |
| 2014/0167183 A1 | 6/2014 | Smayling et al. |

FOREIGN PATENT DOCUMENTS

| | | | |
|---|---|---|---|
| JP | 2013149928 A | 8/2013 | |
| JP | 2013157547 A | 8/2013 | |
| WO | 2015199682 A8 | 12/2015 | |

OTHER PUBLICATIONS

Lam et al., E-beam direct write (EBDW) as complementary lithography, Sep. 2010, Proc. SPIE 7823, Photomask Technology 2010, 78231C, pp. 1-6.*

International Search Report and Written Opinion as received for Patent Application No. PCT/US2014/044105, dated Feb. 27, 2015. 11 pages.

Taiwan Office Action (including TW Search Report and English Translation) received for TW Application No. 104115775 dated May 10, 2016. 9 pages.

"High Bandwidth Fiber Optics for Data Center Networking," Radio & Electronics Formulas & Data, Avago Technologies, (http://www.radio-electronics.com/info/formulae/). Downloaded from the Internet on Apr. 15, 2014. 6 pages.

Lucas, et al., "Double-patterning interactions with wafer processing, optical proximity correction, and physical design flows," Journal of Micro/Nanolithography, MEMS, and MOEMS, vol. 8, Issue 3. Jul. 7, 2009. 2 pages.

Mack, C.A., "Line Edge Roughness," Excerpt from Field Guide to Optical Lithography, SPIE. (http://spie.org/publications/fg06_p66_line_edge_roughness). Downloaded from the Internet on Dec. 19, 2016. 1 page.

International Preliminary Report on Patentability as received for Patent Application No. PCT/US2014/044105, dated Dec. 27, 2016. 7 pages.

Friedberg, Paul, "Accelerating 20nm Double Patterning Verification with IC Validator," (White Paper), SYNOPSYS Accelerating Innovation, 2012. pp. 1-8.

Nakatake, et al., "Regularity-Oriented Analog Placement with Diffusion Sharing and Well Island Generation," IEEE, Jan. 18, 2010. pp. 305-311.

Extended European Search Report received for EP Application No. 14896073.5 dated May 4, 2018. 12 pages.

Notification of Reasons for Refusal received for JP Application No. 2016-567854, dated Apr. 3, 2018. 5 pages.

* cited by examiner

TECHNIQUES FOR FORMING A COMPACTED ARRAY OF FUNCTIONAL CELLS

BACKGROUND

Regular integrated circuit structures, such as field-programmable gate arrays (FPGAs), static random-access memory (SRAM), and other memory and logic devices, typically include a continuous grid of diffusion and gate lines from which logic cells or blocks can then be formed, giving consideration to factors such as the attendant optical lithography design rules and the spacing restrictions imposed thereby. The number of logic cells in such integrated circuit structures has been increasing to, for example, meet the increased performance demands. The increase in the number of logic cells leads to an increase in required area, which can translate to larger chip size requirements and increased costs.

DETAILED DESCRIPTION

Techniques are disclosed for forming a compacted array of functional cells using next-generation lithography (NGL) processes, such as electron-beam direct write (EBDW) and extreme ultraviolet lithography (EUVL), to form the boundaries of the cells in the array. The compacted array of cells may be used for field-programmable gate array (FPGA) structures configured with logic cells, static random-access memory (SRAM) structures configured with bit cells, or other memory or logic devices having cell-based structures. The techniques can be used to gain a reduction in area of 10 to 50 percent, for example, for the array of functional cells, because the NGL processes allow for higher precision and closer cuts for the cell boundaries, as compared to conventional 193 nm photolithography. In addition, the use of NGL processes to form the boundaries for the cells may also reduce lithography induced variations that would otherwise be present with conventional 193 nm photolithography. Numerous configurations and variations will be apparent in light of this disclosure.

General Overview

Figure 1:
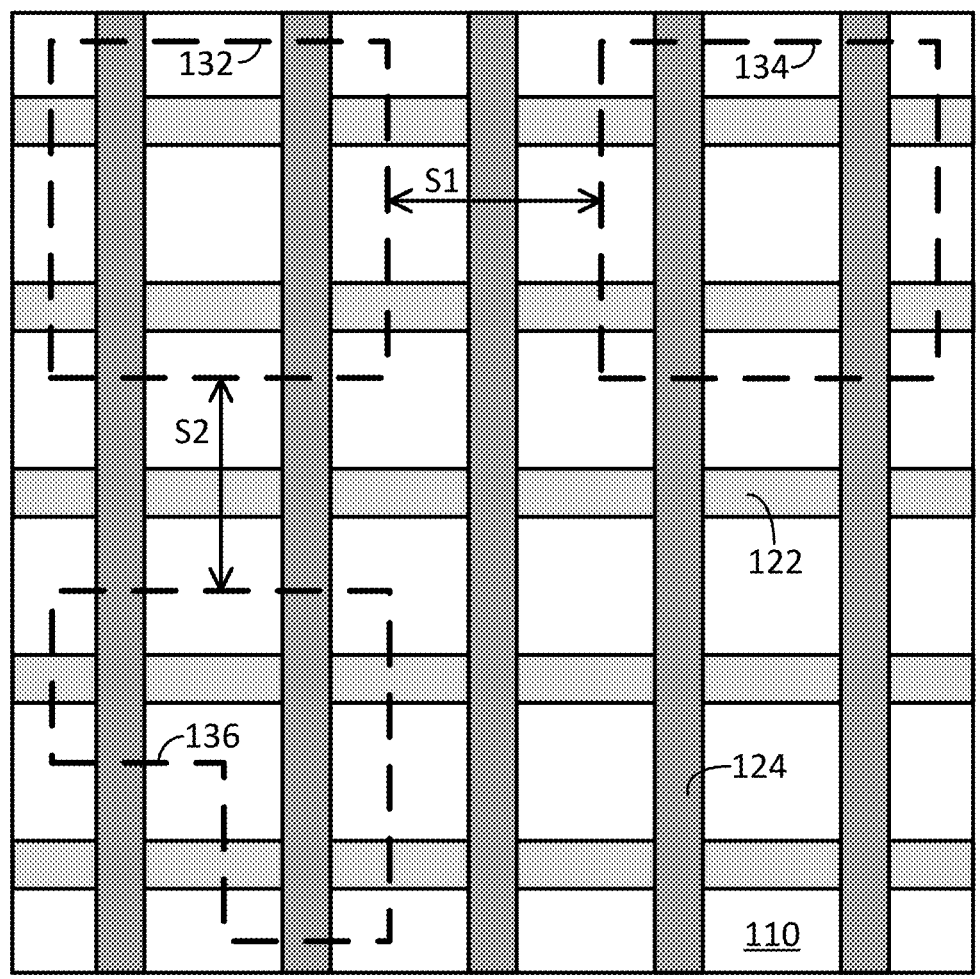
FIG. 1 illustrates an integrated circuit (IC) structure including three logic cells formed on a grid of diffusion lines and gate lines, the boundaries of the logic cells formed using 193 nm photolithography.
Figure 2:
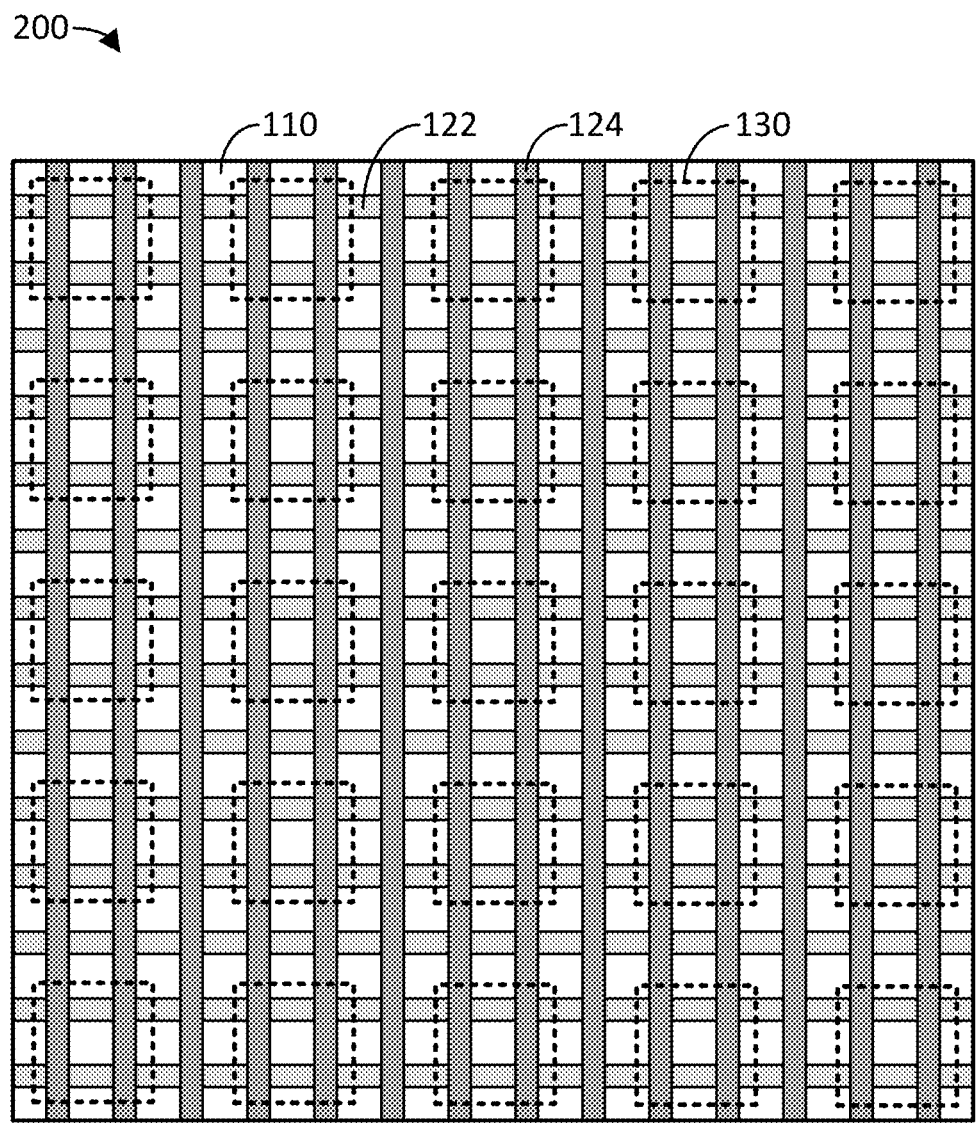
FIG. 2 illustrates an IC structure including a set of logic cells formed on a grid of diffusion lines and gate lines, the boundaries of the logic cells formed using 193 nm photolithography.

As previously described, the increase in the number of logic cells for integrated circuit (IC) structures, such as field-programmable gate arrays (FPGAs), static random-access memory (SRAM), and other logic and memory devices, leads to an increase in required area, which can translate to larger chip sizes requirements and increased costs. Conventionally, 193 nm photolithography has been used to etch/cut diffusion and gate lines to form logic cell boundaries on such IC structures. However, 193 nm photolithography has certain limitations, particularly for sub-100 nm resolution applications. Such limitations include requiring multiple lithography processes, requiring multiple masks, requiring additional materials, lack of precision, lack of capability to form dense components, lack of capability to form sharp angles and edges, and lack of consistency throughout formed structures, just to name a few. For example, FIG. 1 illustrates an IC structure 100 including substrate 110 and three logic cells 132, 134, 136 formed on a grid of diffusion lines 122 and gate lines 124. In another example, FIG. 2 illustrates an IC structure 200 including substrate 110 and twenty-five logic cells 130 formed on a grid of fourteen diffusion lines 122 and fourteen gate lines 124. The boundaries of logic cells 130, 132, 134, 136 (shown in dashed lines) were formed using conventional 193 nm photolithography. As can be seen in FIGS. 1 and 2, the spacing between the boundaries of adjacent logic cells (e.g., spacing S1 between the boundaries of logic cells 132 and 134 and spacing S2 between the boundaries of logic cells 132 and 136) includes either a diffusion or gate line, and that spacing is limited by conventional 193 nm photolithography, particularly for sub-100 nm resolution applications. More specifically, conventional optical lithography design rules impose restrictions to where the gate lines (or sacrificial gate material such as polysilicon, as the case may be) can be cut to form device cells, wherein S1 and S2 represent the minimum distances that must be maintained between the cells.

Thus, and in accordance with one or more embodiments of the present disclosure, techniques are disclosed for forming a compacted array of functional cells using next-generation lithography (NGL) processes, such as electron-beam direct write (EBDW) and extreme ultraviolet lithography (EUVL), to form the boundaries of the cells in the array. As will be apparent in light of the present disclosure, other NGL processes may be used to form the compacted arrays of cells described herein, such as nanoimprint lithography and other maskless and reduced-mask processes. The techniques can be used to form various compacted arrays of logic cells and/or bit cells, such as arrays for FPGAs, SRAM, and other memory or logic or cell-based devices. In some embodiments, the techniques described herein can be used to reduce the space between cells or any cell sub-block level (e.g., as compared to using 193 nm photolithography) and thereby reduce the area needed for the overall array of cells, especially for devices such as FPGAs where the array of logic cells may cover greater than 50, 65, 80, or 90 percent of the chip area.

In some embodiments, forming compacted arrays of functional cells using the techniques described herein (e.g., using EBDW or EUVL) can result in functional cell boundaries having improved line edge roughness (LER), such as LER below 4 nm or below 2 nm, for example. Further, the techniques described herein allow for relatively precise resist to be formed, even when forming resist features having critical dimensions of 30 nm or less (or even 10 nm or less). This increased precision allows the functional cells to be formed with higher density, because the boundaries of the functional cells can be formed with greater precision and can thereby avoid or otherwise reduce lithography induced variations. The techniques described herein may also allow for increased accuracy and/or critical dimension uniformity (CDU) for the boundaries of the functional cells. Irregularly shaped cell boundaries may also be formed more effectively using the techniques described herein (e.g., as compared to what can be achieved using 193 nm photolithography). In addition, these improved results can be achieved with one lithography process and the use of one or no masks (depending upon the specific NGL process used), which is another advantage over 193 nm photolithography, because 193 nm photolithography requires multiple lithography processes and multiple masks to, for example, reach sub-100 nm resolution.

Upon analysis (e.g., using scanning/transmission electron microscopy (SEM/TEM) and/or composition mapping), a structure or device configured in accordance with one or more embodiments will effectively show an IC structure having a compacted array of functional cells as compared to a structure formed using conventional 193 nm photolithography. For example, structures formed using the techniques as variously described herein may include an array of functional cells where the distance between the boundaries of two adjacent cells is less than 100 nm, 50 nm, 30 nm, or 10 nm, or some other suitable cap, as will be apparent in light of this disclosure. Also, the functional cell boundaries may be formed such that no diffusion or gate lines are present between boundaries of adjacent cells, even at sub-100 nm resolutions. Further, such compacted structures may be formed using one lithography process and one or no masks. In addition, the techniques described herein can be used to gain a minimum of 10, 25, 40, or 50 percent reduction in area, or some other suitable minimum area reduction, when forming an array of functional cells (e.g., as compared to forming the boundaries of the cells using conventional 193 nm photolithography). The reduction in area may be measured using the total array area, the end-to-end diffusion distance, or the end-to-end gate distance, for example. Numerous configurations and variations will be apparent in light of this disclosure.

Architecture and Methodology

Figure 3A:
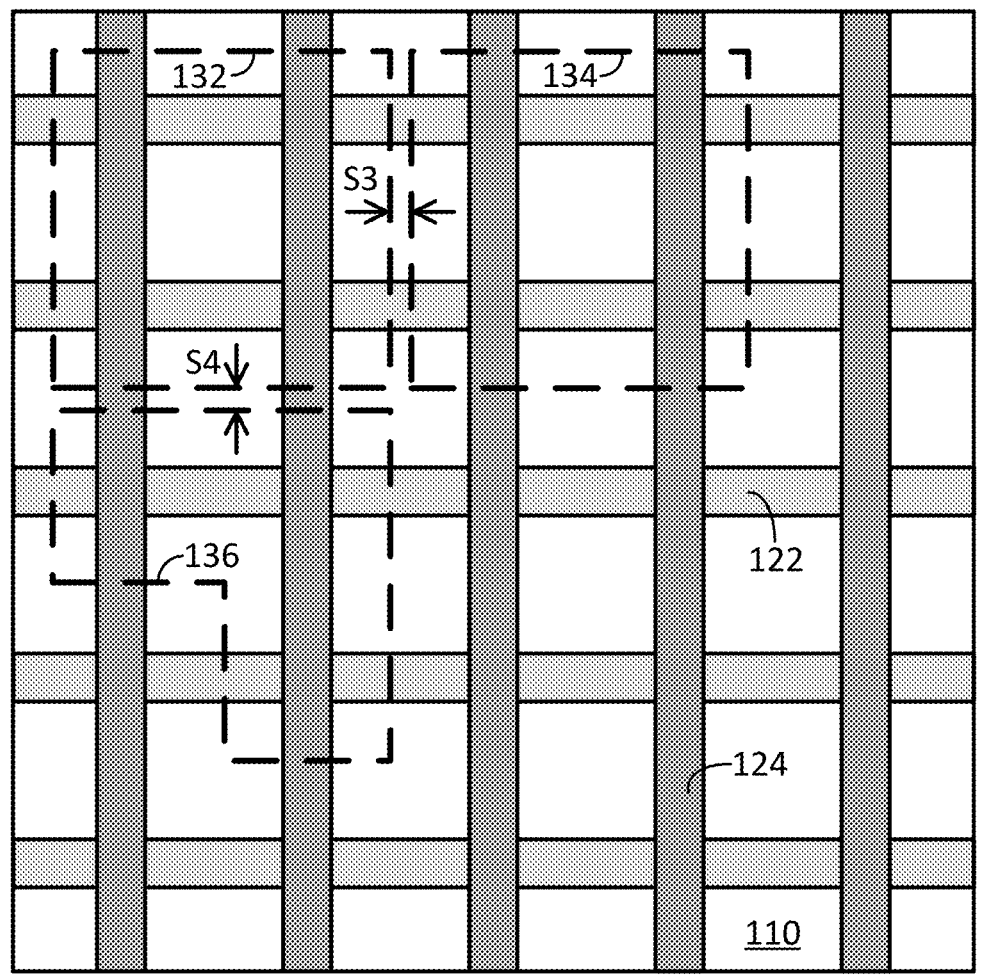
FIG. 3A illustrates an example IC structure including three functional cells formed on a grid of diffusion lines and gate lines, in accordance with an embodiment of the present disclosure.

FIG. 3A illustrates an example IC structure 300 including three functional cells 132, 134, 136 formed on a grid of diffusion lines 122 and gate lines 124, in accordance with an embodiment of the present disclosure. The functional cells 132, 134, 136 may be, for example, logic cells of an FPGA or other logic device, or bit cells of an SRAM or other memory device. Other functional cells that can be provisioned using a grid of diffusion and gate metal, or other suitable grid materials, will be apparent in light of this disclosure. As can be seen, diffusion lines 122 and gate lines 124 are formed on substrate 110. Substrate 110 may be any suitable substrate, such as a semiconductor substrate or an insulator substrate. For example, substrate 300 may comprise silicon (Si), germanium (Ge), silicon germanium (SiGe), one or more III-V materials, glass, an oxide material (e.g., silicon dioxide), a nitride material (e.g., silicon nitride), and/or any other suitable semiconductor or insulator material. In some embodiments, substrate 110 may be configured as a bulk substrate, a semiconductor-on-insulator (XOI, where X is a semiconductor material such as Si, Ge, or SiGe), or a multi-layered structure. Other suitable substrate materials and/or configurations will depend on a given target application or end use, and will be apparent in light of this disclosure.

In the example IC structure 300 shown in FIG. 3A, diffusion lines 122 run horizontally and are shown in light grey for ease of illustration. Diffusion lines 122 may be formed using any suitable techniques, including various patterning, etching, and depositing processes. For example, diffusion lines 122 material may be deposited in and/or on substrate 110 using a physical vapor deposition (PVD) process (such as sputter deposition), a chemical vapor deposition (CVD) process, an atomic layer deposition (ALD) process, a molecular beam epitaxy (MBE) process, and/or any other suitable growth or deposition process. Diffusion lines 122 material may comprise Si, Ge, SiGe, and/or one or more III-V materials, or any other suitable material or combination of materials depending upon the target application or end use. In addition, diffusion lines 122 may be n-type and/or p-type doped, in some embodiments. Note that diffusion lines 122 may not have consistent material from one diffusion line to the next. For example, the diffusion lines 122 may alternate in doping types (e.g., with one line having n-type doping and an adjacent line having p-type doping). Also note that diffusion lines 122 are shown with consistent widths and spacing for ease of illustration; however, the present disclosure is not intended to be so limited. Further note that diffusion lines 122 may be flush with the top surface of substrate 110 (e.g., for planar devices to be built thereupon, such as planar transistors) or diffusion lines 122 may extrude from the top surface of substrate 110 (e.g., for finned devices to be built thereupon, such as finned transistors), or some combination thereof.

Continuing with example IC structure 300, gate lines 124 are shown formed on diffusion lines 122, and gate lines 124 run vertically and are shown in dark grey for ease of illustration. Gate lines 124 may be formed using any suitable techniques, including various patterning, etching, and depositing processes. For example, gate lines 124 material may be deposited using any suitable process, including, but not limited to the previously described deposition techniques (e.g., PVD, CVD, ALD, MBE). Gate lines 124 material may comprise one or more metals or metal alloys, polysilicon, and/or any other suitable materials depending upon the target application or end use. Note that gate lines 124 may not have consistent material from one gate line to the next. Also note that gate lines 124 are shown with consistent widths and spacing for ease of illustration; however, the present disclosure is not intended to be so limited. Further note that gate lines 124 are formed in a grid-like manner over diffusion lines 122 for ease of illustration; however, the present disclosure is also not intended to be so limited. Numerous variations and configurations for diffusion lines 122 and gate lines 124 will be apparent in light of this disclosure.

In the example embodiment shown in FIG. 3A, the boundaries of functional cells 132, 134, 136 are shown in dashed lines. The functional cells may include any suitable structures, such as various logic elements or blocks, RAM blocks, etc., and the present disclosure is not intended to be limited to any particular structure for the functional cells unless otherwise indicated. In this example embodiment, the boundaries of the functional cells are formed using a next-generation lithography (NGL) process, such as electron-beam lithography or electron-beam direct write (EBDW), extreme ultraviolet lithography (EUVL), or nanoimprint lithography, for example. Generally, the techniques for forming the cell boundaries can include forming a resist, patterning the resist using the NGL process, and then etching to separate the diffusion lines 122 and/or gate lines 124 between functional cells. In this manner, compacted arrays of functional cells can be achieved, because the NGL processes allow for the boundaries of the functional cells to be formed with more precision and also allows for the boundaries of adjacent cells to be formed closer to each other (e.g., as compared to 193 nm photolithography), as will be discussed in more detail herein.

The resist (not shown) used to help form the functional cell boundaries may comprise any suitable material, including, but not limited to, an organic photoresist material (e.g., poly(methyl methacrylate), poly(dimethyl glutarimide), phenol formaldehyde resin, SU-8, or other polymer), an inorganic photoresist material (e.g., chalcogenide), a molecular photoresist material (e.g., truxene), a high resolution resist (e.g., hydrogen silsesquioxane (HSQ)), a hybrid of the aforementioned, and/or any other material suitable for use as a resist on the electrically conductive material layer. The resist material may be deposited using any suitable process, including, but not limited to, spin coating. The resist may be deposited on the grid of diffusion lines 122 and gate lines 124 before the functional cells (e.g., cells 132, 134, and 136) are formed, after their formation has been started, or after their formation has been completed, as will be apparent in light of this disclosure. The resist materials and thicknesses may be selected, in some instances, based on the lithography process being used to pattern the resist. For example, when using electron-beam lithography or EBDW, the resist may be an electron sensitive film capable of having its solubility changed by an electron beam. However, in some instances, a suitable photoresist may be used for the electron-beam exposure. Other suitable resist materials and/or configurations will depend on a given target application or end use, and will be apparent in light of this disclosure.

After the resist is deposited, it can be patterned using one or more lithography processes. In some embodiments, the resist is patterned using electron-beam lithography or EBDW, EUVL, nanoimprint lithography, or some other suitable NGL process. In some embodiments, the lithography process may require one or no masks and may also require only one lithography process. For example, EBDW is a maskless lithography process where one or more focused beams of electrons can be used to pattern the resist in a single lithography process. In another example, EUVL uses an extreme ultraviolet wavelength (e.g., 13.5 nm) and a single mask to pattern the resist in a single lithography process. In some such embodiments, the lithography process may be able to achieve high precision resist features even with the use of one or no masks, including being able to achieve sub-100 nm, sub-50 nm, sub-30 nm, or sub-10 nm resolution, for example. In other words, the lithography process used to form IC structure 300, may be able to achieve resist features having sub-100 nm, sub-50 nm, sub-30 nm, or sub-10 nm critical dimensions, as will be discussed in more detail herein.

After the lithography process has been performed, subsequent resist processing may be required to properly pattern the resist. For example, such processing may include using an appropriate solvent to remove the areas that were exposed during the lithography processing or other suitable processing. After the resist has been properly patterned, the underlying diffusion lines 122, gate lines 124, and/or substrate 110 can be etched to transfer the pattern and form the boundaries of the functional cells. As will be apparent in light of this disclosure, the boundaries may be formed by simply breaking/cutting/etc. diffusion lines 122 and/or gate lines 124 to separate functional cells as desired. Any suitable wet or dry etch may be used, and in some embodiments, the etchant and/or etch process may be dictated by the resist properties (e.g., the material and/or thickness of the resist) and/or the properties of the electrically conductive layer (e.g., the material and/or thickness of the layer). Once the resist pattern is transferred, the resist may be removed using any suitable process, such as a resist stripping or planarization process.

As can be seen in FIG. 3A, the distance between the boundaries of functional cells 132 and 134 is space S3, and the distance between the boundary of functional cell 136 and the boundaries of cells 132 and 134 is space S4. Spaces S3 and S4 can be compared to spaces S1 and S2, respectively, shown on IC structure 100 of FIG. 1. Recall that the boundaries of cells 132, 134, 136 on IC structure 100 were formed using conventional 193 nm photolithography, and thus, the minimum achievable distance between boundaries of adjacent cells (e.g., S1 and S2) are restricted based on the conventional lithography process. Using NGL processes, such as EBDW and EUVL, the same cells 132, 134, 136 can be moved closer together. For example S3 and S4 may be less than 100 nm, 50 nm, 30 nm, or 10 nm, or some other suitable cap, as will be apparent in light of the present disclosure. Spaces S3 and S4 are equivalent in this example embodiment; however, that need not be the case. For example, the horizontal spacing between adjacent cells need not be equal to the vertical spacing between adjacent cells (although they can be equivalent, as is the case in FIG. 3A). Further, note that in the conventional IC structure 100 shown in FIG. 1, there is a diffusion or gate line between the boundaries of adjacent cells. For example, a gate line is located between the boundaries of cells 132 and 134 in space S1, and a diffusion line is located between the boundaries of cells 132 and 136 in space S2. However, using a NGL process to form the cell boundaries allows for there to be no diffusion or gate lines between the boundaries of cells, even in sub-100 nm applications, as can be seen in FIG. 3A. Further, such precision and compacted array of can be formed using one lithography process and one or no masks, as previously described.

Figure 3B:
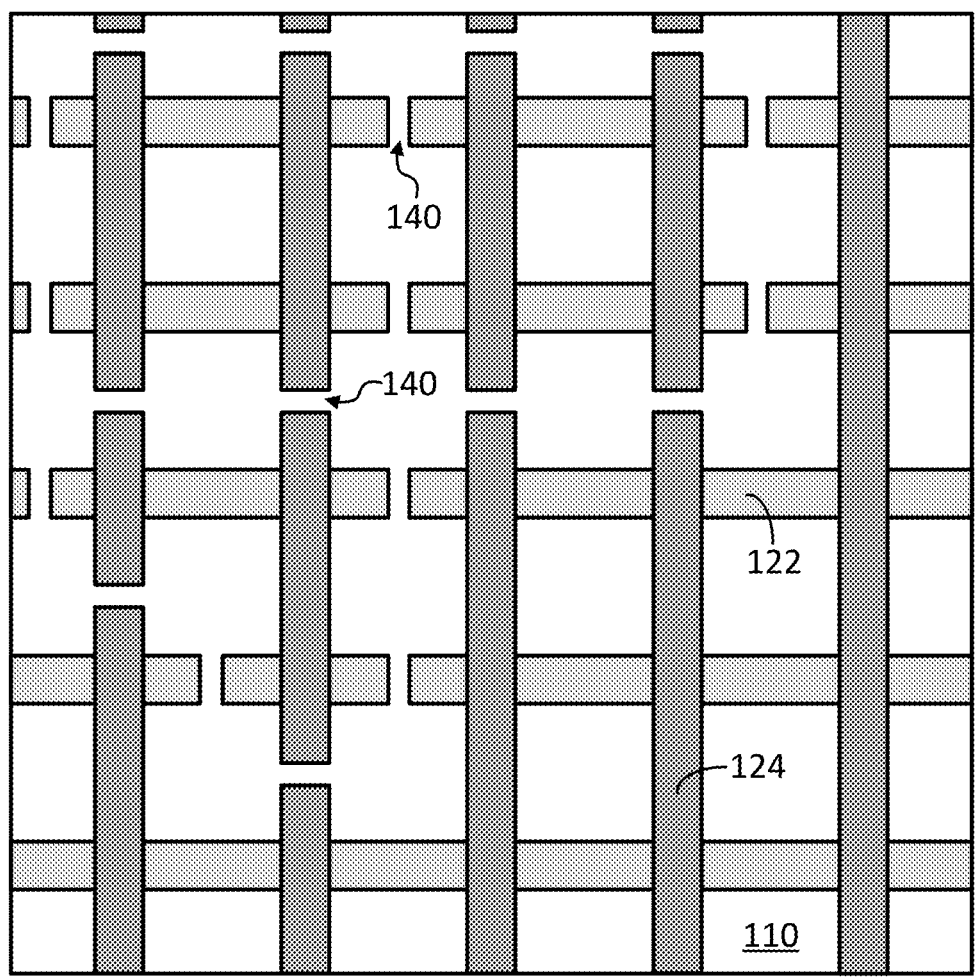
FIG. 3B illustrates cuts in the grid of diffusion lines and gate lines made to form the three functional cells of FIG. 3A.

FIG. 3A shows the boundaries for logic cells 132, 134, 136, but does not show the actual cuts in diffusion lines 122 and gate lines 124, for ease of illustration. FIG. 3B shows the IC structure 300 of FIG. 3A illustrating cuts 140 in the grid of diffusion lines 122 and gate lines 124. As can be seen, cuts 140 separate or otherwise divide diffusion lines 122 and gate lines 124 such that they are no longer in physical and/or electrical contact. Therefore, cuts 140 allow functional cells (e.g., cells 132, 134, 136) to be electrically isolated from each other. Cuts 140 can be made using the techniques described herein, such as using an NGL process (e.g., EBDW, EUVL, etc.) to pattern resist and allow for cuts 140 to be etched into the grid of diffusion lines 122 and gate lines 124, thereby forming the functional cell boundaries shown in FIG. 3A.

Figure 4:
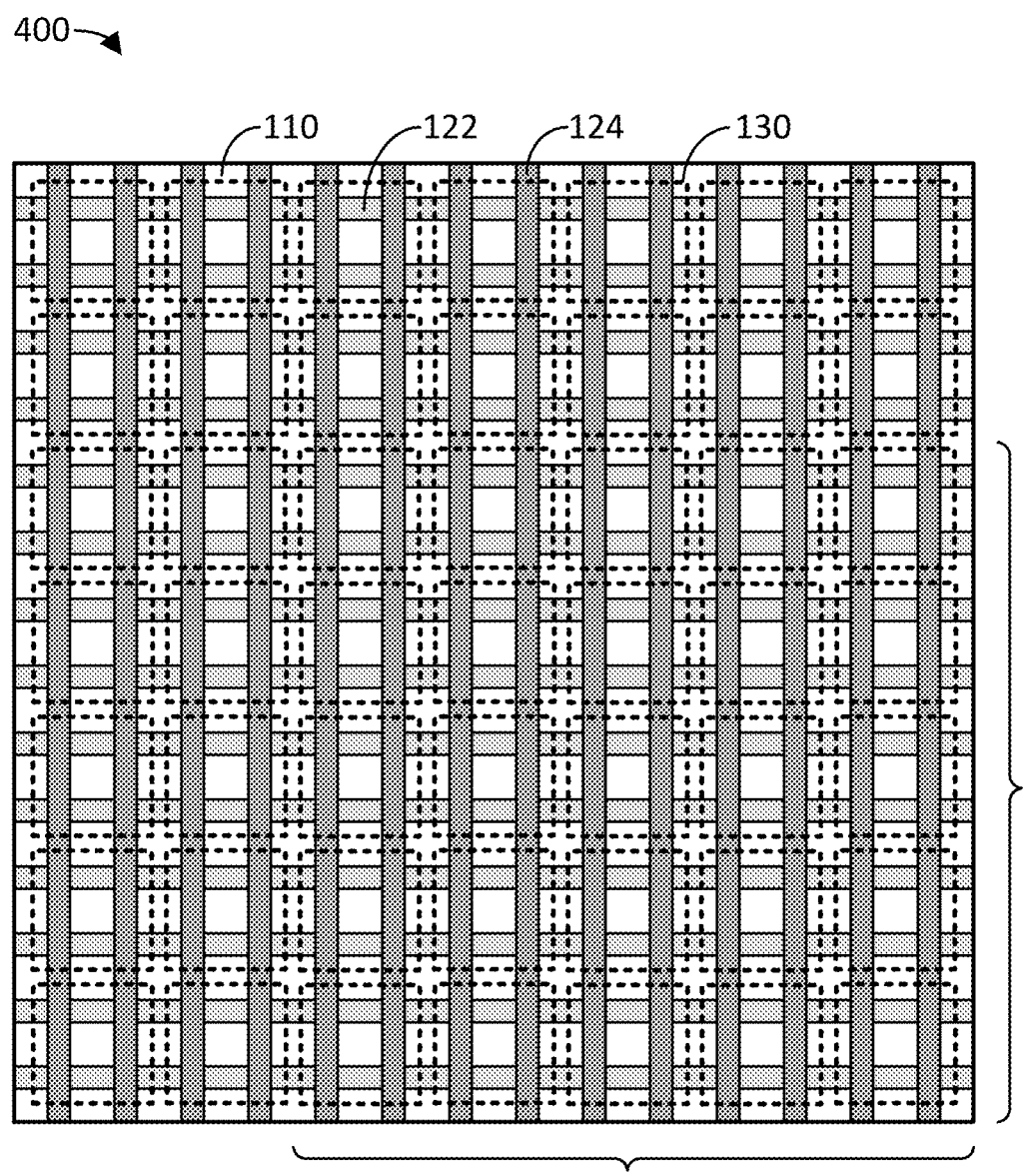
FIG. 4 illustrates an example IC structure including an array of functional cells formed on a grid of diffusion lines and gate lines, in accordance with an embodiment of the present disclosure.

FIG. 4 illustrates an example IC structure 400 including an array of functional cells 130 formed on a grid of diffusion lines 122 and gate lines 124, in accordance with an embodiment of the present disclosure. As can be seen, IC structure 400 is a square that includes fourteen diffusion lines 122 and fourteen gate lines 124 formed on substrate 110, similar to the structure shown in FIG. 2. The previous discussion with respect to substrate 110, diffusion lines 122, and gate lines 124 is equally applicable in this example embodiment. Recall that IC structure 200 shown in FIG. 2 includes an array of twenty-five cells having boundaries formed using conventional 193 nm photolithography. The IC structure 400 shown in FIG. 4 includes functional cells 130 having boundaries formed using a NGL process, such as EBDW or EUVL. Comparing IC structure 200 with the IC structures shown in FIG. 4, it can be seen that the array of functional cells in the IC structure 400 shown in FIG. 4 is more dense or compact. As can also be seen, twenty-five functional cells 130 (which is the total amount of cells in the array on conventional IC structure 200 of FIG. 2) fit within the square area in FIG. 4 indicated by the bracketed lines in the lower right corner of IC structure 400. This area represents approximately 51 percent of the total area of the IC structure 400 shown in FIG. 4. Therefore, the techniques described herein can be used to fit an array containing the same number of functional cells (e.g., twenty-five, in this example case) into an area that is only 51 percent of the original area size, thereby gaining a 49 percent reduction in area. In some embodiments, the techniques variously described herein can be used to gain a minimum of 10, 25, 40, or 50 percent reduction in area for the array of functional cells, or some other suitable minimum area reduction, as will be apparent in light of this disclosure.

Figure 5:
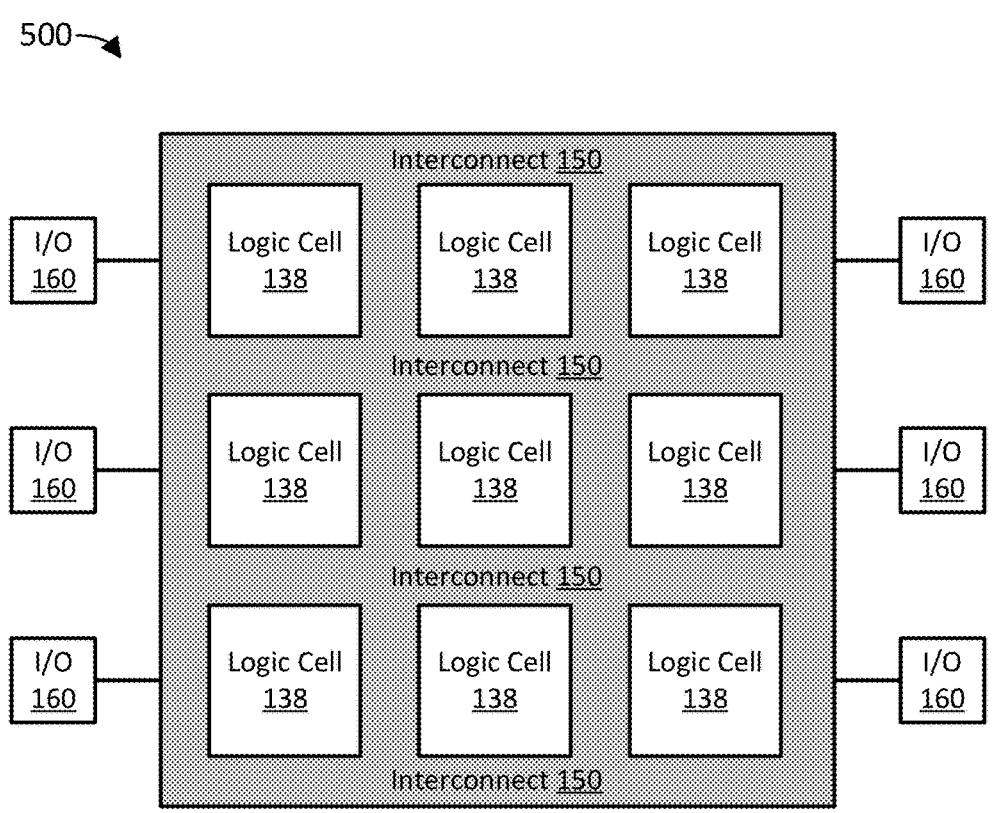
FIG. 5 illustrates an example field-programmable gate array (FPGA) structure, including an array of functional cells configured in accordance with an embodiment.

FIG. 5 illustrates an example field-programmable gate array (FPGA) structure 500, including an array of logic cells 138 configured in accordance with an embodiment. As can be seen, FPGA structure 500 includes an array of nine logic cells 138 that were formed using the techniques described herein (e.g., cutting the boundaries of the logic cells using a NGL process). The logic cells 138 may be known as logic elements (LEs) or combinational logic blocks (CLBs), and logic cells 138 may form the function of several logic gates. As can be understood, logic cells 138 are the functional cells of FPGA structure 500. Interconnections are made between logic cells 138 using programmable interconnect 150. Interconnect 150 may be logically organized into channels or other units, for example. The I/O pins may be referred to as I/O blocks 160 and they are generally programmable to be inputs or outputs. I/O blocks 160 can also provide other features such as low-power or high-speed connections, for example. Memory (not shown) may also be included in the FPGA structure 500, as well as other typical or suitable componentry, depending upon the target application or end use. Numerous variations and configurations will be apparent in light of this disclosure.

Example System

Figure 6:
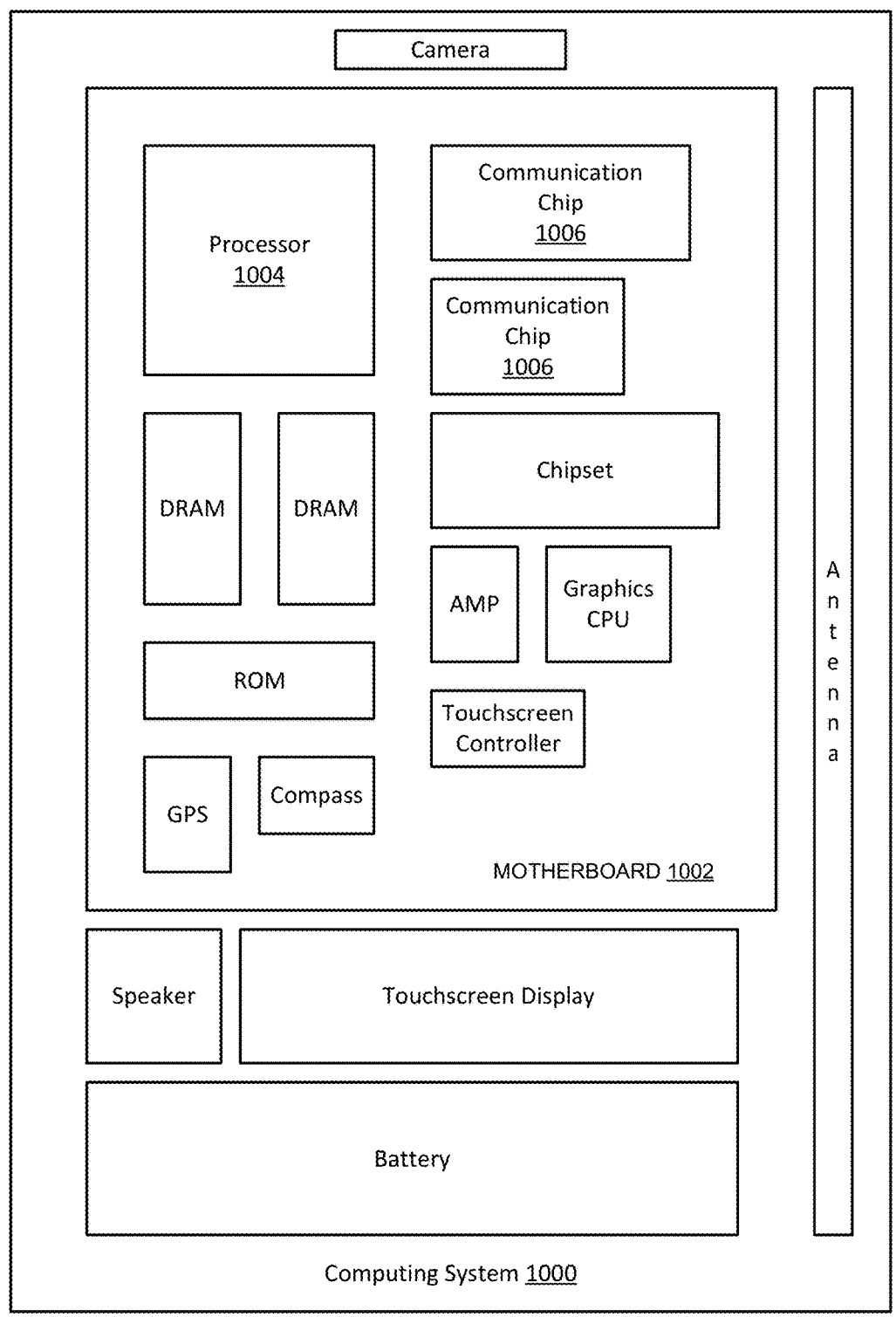
FIG. 6 illustrates a computing system implemented with integrated circuit structures or devices formed using the techniques disclosed herein, in accordance with an example embodiment.

FIG. 6 illustrates a computing system 1000 implemented with integrated circuit (IC) structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM, STTM, etc.), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In some embodiments, the computing system 1000 may include field-programmable gate arrays (FPGAs), static random-access memory (SRAM), and/or other logic or memory devices, including a compacted array of functional cells formed using the techniques described herein. The functional cells may be logic cells (e.g., in the case of FPGAs) and/or bit cells (e.g., in the case of SRAM), or any other suitable functional cells based on the target application or end used.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a substrate; and an array of functional cells formed on the substrate, each cell having a boundary; wherein the distance between the boundaries of two adjacent cells in the array is less than 50 nm.

Example 2 includes the subject matter of Example 1, wherein the substrate comprises silicon (Si) and/or germanium (Ge).

Example 3 includes the subject matter of any of Examples 1-2, wherein the distance between the boundaries of two adjacent cells in the array is less than 20 nm. Example 4 includes the subject matter of any of Examples 1-3, wherein the cells include gate array logic cells and/or memory bit cells.

Example 5 includes the subject matter of any of Examples 1-4, wherein the cells are formed on a grid of diffusion lines and gate lines.

Example 6 includes the subject matter of any of Examples 1-5, wherein there are no gate or diffusion lines between the boundaries of two adjacent cells.

Example 7 includes the subject matter of any of Examples 1-6, wherein the array of cells is between 10 and 50 percent more dense than the densest effective structure capable of being formed using 193 nm photolithography to form the boundaries of the cells.

Example 8 is a field-programmable gate array (FPGA) device including the subject matter of any of Examples 1-7.

Example 9 is a static random-access memory (SRAM) device including the subject matter of any of Examples 1-7.

Example 10 is a computing system including the subject matter of any of Examples 1-7.

Example 11 is a method of forming an integrated circuit, the method including: providing a substrate; forming a plurality of diffusion lines; forming a plurality of gate lines, wherein the diffusion and gate lines are formed in a grid-like structure; forming a resist on the grid-like structure; patterning the resist to form functional cell boundaries using a lithography process that requires one or no masks and is capable of achieving resist features having sub-100 nm critical dimensions, wherein the cells are arranged in an array; and etching the pattern into the grid-like structure.

Example 12 includes the subject matter of Example 11, wherein the cells include gate array logic cells and/or memory bit cells. Example 13 includes the subject matter of any of Examples 11-12, wherein the lithography process is electron-beam lithography.

Example 14 includes the subject matter of Example 13, wherein the electron-beam lithography includes multiple beams.

Example 15 includes the subject matter of any of Examples 11-14, wherein the lithography process is maskless.

Example 16 includes the subject matter of any of Examples 11-12, wherein the lithography process is extreme ultraviolet lithography (EUVL).

Example 17 includes the subject matter of any of Examples 11-12, wherein the lithography process is nanoimprint lithography. Example 18 includes the subject matter of any of Examples 11-17, wherein the lithography process is capable of achieving resist features having sub-30 nm critical dimensions.

Example 19 includes the subject matter of any of Examples 11-18, wherein the lithography process is capable of achieving resist features having sub-10 nm critical dimensions.

Example 20 includes the subject matter of any of Examples 11-19, further including forming a field-programmable gate array (FPGA) device that includes the array of cells.

Example 21 includes the subject matter of any of Examples 11-19, further including forming a static random-access memory (SRAM) device that includes the array of cells.

Example 22 is a method of forming an array of functional cells, the method including: providing a substrate; forming a resist on the substrate; patterning the resist to form functional cell boundaries, wherein the distance between the boundaries of two adjacent cells is less than 50 nm; and etching the pattern into the substrate.

Example 23 includes the subject matter of Example 22, wherein the cells include gate array logic cells and/or memory bit cells.

Example 24 includes the subject matter of any of Examples 22-23, wherein the lithography process is electron-beam lithography.

Example 25 includes the subject matter of Example 24, wherein the electron-beam lithography includes multiple beams.

Example 26 includes the subject matter of any of Examples 22-25, wherein the lithography process is maskless.

Example 27 includes the subject matter of any of Examples 22-23, wherein the lithography process is extreme ultraviolet lithography (EUVL).

Example 28 includes the subject matter of any of Examples 22-23, wherein the lithography process is nanoimprint lithography.

Example 29 includes the subject matter of any of Examples 22-28, wherein the lithography process is capable of achieving resist features having sub-30 nm critical dimensions.

Example 30 includes the subject matter of any of Examples 22-29, wherein the lithography process is capable of achieving resist features having sub-10 nm critical dimensions. Example 31 includes the subject matter of any of Examples 22-30, further including forming a field-programmable gate array (FPGA) device that includes the array of cells.

Example 32 includes the subject matter of any of Examples 22-30, further including forming a static random-access memory (SRAM) device that includes the array of cells.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
a substrate;
a grid including diffusion lines extending from the substrate: and
an array of functional cells including two adjacent cells, the two adjacent cells at least in part on at least three diffusion lines included in the grid, each cell having a boundary with no diffusion lines between the boundaries of the two adjacent cells, such that one of the two adjacent cells includes two or more of the at least three diffusion lines and the other of the two adjacent cells includes one or more of the at least three diffusion lines;
wherein a distance between the boundaries of the two adjacent cells is less than 50 nanometers (nm).

2. The integrated circuit of claim 1, wherein the substrate comprises silicon (Si) and/or germanium (Ge).

3. The integrated circuit of claim 1, wherein the distance between the boundaries of the two adjacent cells is less than 20 nm.

4. The integrated circuit of claim 1, wherein the two adjacent cells include a gate array logic cell and/or a memory bit cell.

5. The integrated circuit of claim 1, wherein the grid also includes gate lines perpendicular to the diffusion lines, and wherein the two adjacent cells share one or more of the gate lines.

6. The integrated circuit of claim 5, wherein the two adjacent cells share two or more of the gate lines.

7. The integrated of claim 1, wherein the array of functional cells is between 10 and 50 percent more dense than the densest effective structure capable of being formed using 193 nm photolithography to form the boundaries of the cells.

8. A field-programmable gate array (FPGA) device comprising the integrated circuit of claim 1.

9. A static random-access memory (SRAM) device comprising the integrated circuit of claim 1.

10. A computing system comprising the integrated circuit of claim 1.

11. The integrated circuit of claim 1, wherein the distance between the boundaries of the two adjacent cells is less than 10 nm.

12. The integrated circuit of claim 1, wherein the boundaries of the two adjacent cells have a line edge roughness of below 4 nm.

13. The integrated circuit of claim 5, wherein the array of functional cells includes another cell adjacent one of the two adjacent cells, and no gate lines are between the boundaries of the another cell and the one of the two adjacent cells.

14. A method of forming an integrated circuit, the method comprising:
providing a substrate;
providing a grid including diffusion lines extending from the substrate: and
providing an array of functional cells including two adjacent cells, the two adjacent cells at least in part on at least three diffusion lines included in the grid, each cell having a boundary with no diffusion lines between the boundaries of the two adjacent cells, such that one of the two adjacent cells includes two or more of the at least three diffusion lines and the other of the two adjacent cells includes one or more of the at least three diffusion lines;
wherein a distance between the boundaries of the two adjacent cells is less than 50 nm.

15. The method of claim 14, wherein the two adjacent cells include a gate array logic cell and/or a memory bit cell.

16. The method of claim 14, wherein the array of functional cells is provided using electron-beam lithography.

17. The method of claim 16, wherein the electron-beam lithography includes multiple beams.

18. The method of claim 14, wherein the array of functional cells is provided using a maskless lithography process.

19. The method of claim 14, wherein the array of functional cells is provided using extreme ultraviolet lithography (EUVL).

20. The method of claim 14, wherein the array of functional cells is provided using nanoimprint lithography.

21. The method of claim 14, wherein the distance between the boundaries of the two adjacent cells is less than 20 nm.

22. The method of claim 14, wherein the distance between the boundaries of the two adjacent cells is less than 10 nm.

23. The method of claim 14, wherein the grid also includes gate lines perpendicular to the diffusion lines, and wherein the two adjacent cells share one or more of the gate lines.

24. The method of claim 14, wherein the array of functional cells is between 10 and 50 percent more dense than the densest effective structure capable of being formed using 193 nm photolithography to form the boundaries of the cells.

25. The method of claim 14, wherein the boundaries of the two adjacent cells have a line edge roughness of below 4 nm.

* * * * *